United States Patent [19]

Kohashi et al.

[11] Patent Number: 4,745,294
[45] Date of Patent: May 17, 1988

[54] PHOTOCOUPLER WITH LIGHT EMITTING AND RECEIVING ELEMENTS COUPLED THROUGH A SOFT RESIN

[75] Inventors: Ikuo Kohashi, Tenri; Hajime Kashida, Nara; Shin Satoh, Kashihara, all of Japan

[73] Assignee: Sharp Kabushiki Kaisha, Osaka, Japan

[21] Appl. No.: 839,875

[22] Filed: Mar. 14, 1986

[30] Foreign Application Priority Data

Apr. 1, 1985 [JP] Japan ................................ 60-69371

[51] Int. Cl.$^4$ .......................................... H01L 31/12
[52] U.S. Cl. .................................... 250/551; 357/19
[58] Field of Search ............... 250/239, 551; 455/602; 357/72, 19

[56] References Cited

U.S. PATENT DOCUMENTS

| 4,160,308 | 7/1979 | Courtney et al. | 250/551 |
| 4,412,135 | 10/1983 | Awaji | 250/551 |
| 4,418,284 | 11/1983 | Ogawa et al. | 250/578 |

FOREIGN PATENT DOCUMENTS

| 0088383 | 7/1981 | Japan | 357/19 |
| 0169279 | 10/1982 | Japan | 357/19 |
| 0130487 | 7/1984 | Japan | 357/19 |

Primary Examiner—Edward P. Westin
Assistant Examiner—Charles F. Wieland
Attorney, Agent, or Firm—Flehr, Hohbach, Test, Albritton & Herbert

[57] ABSTRACT

A photocoupler comprises a light-emitting element and a light-receiving element which are optically coupled through a soft light-transmissive resin and covered by a light-blocking resin. The light-emitting element is covered by a light-transmissive protective hard resin and hence is protected against external pressure.

3 Claims, 1 Drawing Sheet

U.S. Patent    May 17, 1988    4,745,294
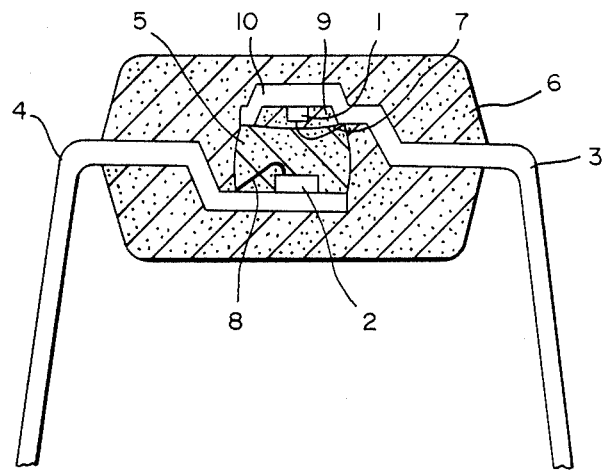
FIG.—1
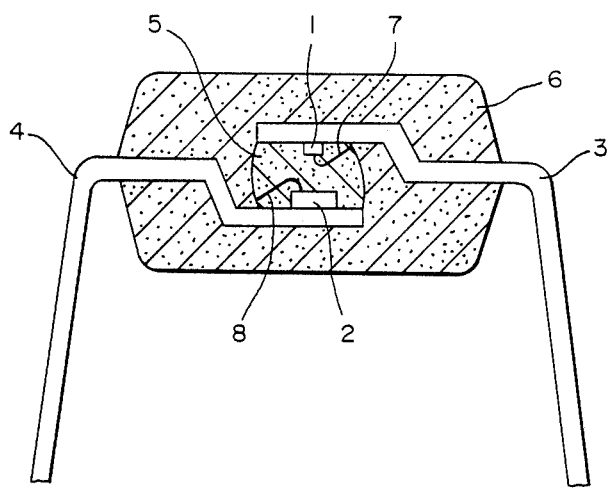
FIG.—2

PHOTOCOUPLER WITH LIGHT EMITTING AND RECEIVING ELEMENTS COUPLED THROUGH A SOFT RESIN

This invention relates to an optically coupled semiconductor device, or a photocoupler.

FIG. 2 shows the structure of an example of a photocoupler which was considered previously and uses a light-transmissive resin for photocoupling. A light-emitting element 1 and a light-receiving element 2 are connected by die bonding respectively to lead frames 3 and 4 and face each other, optically coupled together by means of a light-transmissive resin 5. The entire assembly described above is covered by a light-blocking resin 6. Numerals 7 and 8 indicate metallic wires for establishing electrical connections by wire bonding with other lead frames which are not shown in the Figure.

One of the characteristics required of a photocoupler is the insulative voltage resistance between the input and the output. In the case of a photocoupler structured as shown in FIG. 2, tightness of contact at the boundary surface between the light-transmissive and light-blocking resins 5 and 6 is important because its insulative voltage resistance characteristics are easily deteriorated by the surface discharge between them.

In view of the above, improvements have been made in this technology by using a softer light-transmissive resin instead of a harder material and further by using a gel material rather than a rubber-like material. As for the light-blocking resin 6, it is generally formed by a transfer mold. In order to improve its contact with the light-transmissive resin 5, the transfer mold material pressure is increased.

If a soft, gel-type light-transmissive resin 5 is used and the transfer mold material pressure of the light-blocking resin 6 which covers it is increased, however, the pressure exerted on the light-emitting element 1 and the light-receiving element 2 becomes enormous. Depending on the structure of the light-emitting element 1, in particular, this pressure may have adverse effects on the junction.

It is therefore an object of the present invention to provide a photocoupler with a reduced pressure applied to the light-emitting element.

It is another object of the present invention to provide a photocoupler with improved insulative voltage resistance.

It is still another object of the present invention to eliminate undesirable effects on the junction of a photocoupler due to a high pressure.

The above and other objects of the present invention are achieved by providing a photocoupler comprising a light-emitting element and a light-receiving element optically coupled to each other through a soft light-transmissive resin wherein the light-emitting element is preliminarily covered by a hard light-transmissive protective resin. A still more desirable result is obtained if a concave section taller than the light-emitting element is provided to the lead frame on the side of the light-emitting element.

The accompanying drawings, which are incorporated in and form a part of the specification, illustrate an embodiment of the present invention and, together with the description, serve to explain the principles of the invention. In the drawings:

FIG. 1 is a sectional view of a photocoupler embodying the present invention, and FIG. 2 is a sectional view of a photocoupler considered previously.

Reference being made to FIG. 1, wherein components similar to those in FIG. 2 are indicated by the same numerals, a light-emitting element 1 and a light-receiving element 2 are attached respectively to lead frames 3 and 4 by die bonding and are optically coupled to each other through a light-transmissive resin 5. The assembly described above is covered by a light-blocking resin 6 and gold wires 7 and 8 are provided to electrically connect to other lead frames (not shown) by wire bonding. The light-transmissive resin 5 is soft and of gel-type and the light-blocking resin 6 is formed by transfer molding with increased material pressure in order to improve the tightness of connection with the light-transmissive resin 5.

According to the present invention, unlike the example illustrated in FIG. 2, the light-emitting element 1 is coated with a transparent, protective hard resin 9 before its optical coupling is established by the light-transmissive resin 5. Moreover, the lead frame 3 on the side of the light-emitting element 1 is provided with an indentation, or a concave section, 10 of depth in excess of the height of the light-emitting element 1 so that the coating can be effected easily and the hard protective resin 9 can cover the light-emitting element 1 completely. This indentation 10 has the additional advantage of reflecting the light from the light-emitting element 1 so as to improve the rate of light transmission.

To summarize the advantages of the present invention, since the light-emitting element is covered by a light-transmissive protective hard resin, the pressure applied to the light-emitting element does not increase significantly even if the light-transmissive resin for optical coupling with the light-receiving element is soft and in the form of a gel, and if the transfer molding material pressure of the light-blocking resin covering it is increased. This has the consequence of eliminating adverse effects on the junction. Contact between the light-transmissive resin and the light-blocking resin in this case is clearly very firm and this improves insulative voltage resistance. The indentation provided to the lead frame on the side of the light-emitting element simplifies the process of coating the light-emitting element with a hard protective resin and makes it possible to completely and securely cover the light-emitting element. The indentation further serves to improve the rate of light transmission through reflections.

The foregoing description of a preferred embodiment of the invention has been presented for purposes of illustration and description. It is not intended to be exhaustive or to limit the invention to the precise form disclosed, and obviously many modifications and variations are possible in light of the above teaching. Such modifications and variations which may be apparent to a person skilled in the art are intended to be included within the scope of the invention.

What is claimed is:

1. A photocoupler comprising an assembly including a light-emitting element, a hard light-transmissive protective resin covering said light-emitting element, a light-receiving element and a soft light-transmissive resin, said light-emitting element and said light-receiving element being optically coupled through said soft light-transmissive resin, and a light-blocking resin which is formed by transfer molding and encapsulates said assembly therein.

2. The photocoupler of claim 1 further comprising a lead frame to which said light-emitting element is attached, said lead frame having an indentation of depth greater than the height of said light-emitting element, said light-emitting element being disposed in said indentation.

3. The photocoupler of claim 2 wherein said light-emitting element is attached to said lead frame by die bonding.

* * * * *